(12) United States Patent
Huang et al.

(10) Patent No.: US 6,479,344 B2
(45) Date of Patent: *Nov. 12, 2002

(54) METHOD OF FABRICATING DRAM CAPACITOR

(75) Inventors: Kuo-Tai Huang, Hsinchu (TW); Wen-Yi Hsieh, Hsinchu (TW); Tri-Rung Yew, Hsinchu Hsien (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/542,715

(22) Filed: Apr. 4, 2000

(65) Prior Publication Data

US 2002/0081803 A1 Jun. 27, 2002

Related U.S. Application Data

(62) Division of application No. 09/172,458, filed on Oct. 14, 1998, now Pat. No. 6,218,238.

(30) Foreign Application Priority Data

Sep. 11, 1998 (TW) .......................................... 87115163 A

(51) Int. Cl.[7] ......................................... H01L 21/8242
(52) U.S. Cl. ..................... 438/253; 438/239; 438/253; 438/396

(58) Field of Search ..................... 438/3, 238, 239–241, 438/243, 253, 386, 387, 389, 396, 240

(56) References Cited

U.S. PATENT DOCUMENTS

| 5,486,488 A | * | 1/1996 | Kamiyama | 437/760 |
| 5,939,748 A | * | 8/1999 | Takaishi | 257/310 |
| 6,096,597 A | * | 8/2000 | Tsu et al. | 438/240 |

FOREIGN PATENT DOCUMENTS

JP 10-107218 * 4/1998

* cited by examiner

*Primary Examiner*—Tuan H. Nguyen
*Assistant Examiner*—Thanhha Pham
(74) *Attorney, Agent, or Firm*—J.C. Patents

(57) ABSTRACT

A method of fabricating a DRAM capacitor uses tungsten nitride in the process of forming a capacitor. The structure of the capacitor is simple and the process is easily executed. Furthermore, the invention provides a method of forming tungsten nitride, comprising a step of implanting nitrogen into a tungsten silicide layer and a step of executing a rapid thermal process under ammonia gas to form a tungsten nitride layer on the surface of the tungsten silicide layer. The method of fabricating a DRAM capacitor comprises forming the tungsten silicide layer after forming a part smaller than a bottom electrode of the capacitor from doped polysilicon and forming tungsten nitride on the surface of the tungsten nitride layer.

3 Claims, 5 Drawing Sheets

METHOD OF FABRICATING DRAM CAPACITOR

CROSS-REFERENCE TO RELATED APPLICATION

This application is a division of Ser. No. 09/172,458 filed Oct. 14, 1998, now U.S. Pat. No. 6,218,238 and claims the priority benefit of Taiwan application Serial no. 87115163, filed Sep. 11, 1998, the full disclosure of which is incorporated herein by reference.

BACKGROUND OF THE INVENTION

1. Field of the Invention

The invention relates in general to the fabrication of dynamic random access memory (DRAM) capacitor, and more particularly to applying tungsten nitride (WN) in DRAM capacitors.

2. Description of the Related Art

The conventional structure of capacitors is stacked with metal-insulator-silicon (MIS). A polysilicon layer used as the electrode of a capacitor oxidizes easily at its surface to form a native oxide layer. The native oxide layer decreases the dielectric constant of a dielectric layer and reduces its capacitance, thereby decreasing the quality of the dielectric layer.

In response, a conventional method improves the problem described above by using a metal layer to replace the polysilicon layer. This means a capacitor structure stacked with metal-insulator-metal (MIM) is provided. Furthermore, the capacitor structure is used in fabrication of a nonvolatile ferroeletric memory (FeRAM) and a capacitor with a high dielectric constant, as used in highly integrated DRAM.

Nevertheless, it is difficult to directly fill a metal material into a contact in the conventional structure of the MIM capacitor. Since the step-coverage of metal is imperfect, a polysilicon layer and a barrier layer (or an adhesion layer) must be provided to fill the contact before providing the metal layer as a bottom electrode of the capacitor. This makes the process more complex. Also, the surface area of the bottom electrode is increased for improved capacitance. The metal is usually thick to achieve the object described above. But forming the thick metal layer induces a microloading effect that makes the etching process more complex and time-consuming.

Tungsten nitride is suitable for use in the metal layer of the capacitor because of its great oxidation resistance and for compatibility with chemical vapor deposition process. However, when tungsten nitride comes directly into contact with polysilicon, tungsten nitride may peel due to poor adhesion between tungsten nitride and polysilicon. Therefore, it is necessary to provide a diffusion barrier layer between tungsten nitride and polysilicon.

Additionally, a conventional method of forming tungsten nitride provides performance of a rapid thermal process after implanting nitrogen into tungsten silicide. But tungsten nitride formed in this method has a slow growth rate and has poor uniformity, which decreases the conductivity of the tungsten nitride.

SUMMARY OF THE INVENTION

It is therefore the object of the invention to provide an improved and simplified method of fabricating DRAM capacitors. This method uses tungsten nitride as the MIM capacitor structure.

The invention achieves the above-identified objects by providing a method of fabricating DRAM capacitors. Tungsten nitride is used in fabrication of capacitors having a simple structure. Also, the process of forming the capacitor is easily performed. A doped polysilicon layer is provided, in a portion smaller than a bottom electrode of a capacitor. Then, a tungsten silicide layer is formed, and a tungsten nitride layer is formed on the surface of the tungsten silicide layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

First Embodiment

FIGS. 1A to 1F are cross-sectional views showing the process steps of a first embodiment process of fabricating a DRAM capacitor.

Figure 1A:
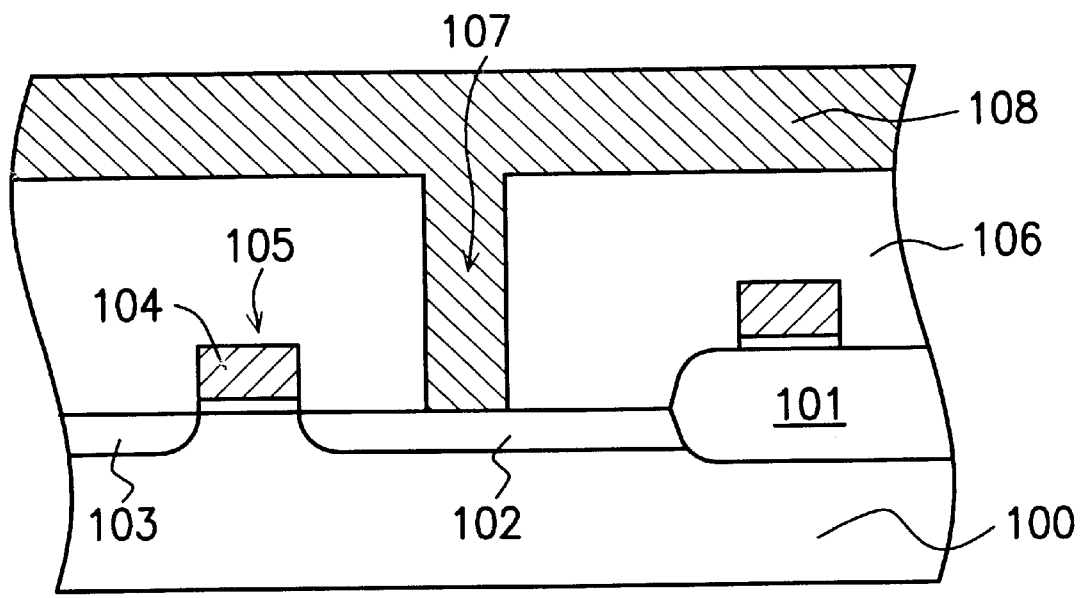
FIGS. 1A to 1F are cross-sectional views showing the process steps of a first embodiment process of fabricating a DRAM capacitor.

Referring first to FIG. 1A, a semiconductor substrate 100, for example, a P-type substrate is provided. A field transistor 105 is formed on the surface of the semiconductor substrate 100. The field transistor 105 is formed on an active region of the semiconductor substrate 100. A field oxide region, a shallow trench isolation (STI) or other structure like this is used as an insulating isolation. The field transistor 105 comprises a gate structure 104 and source/drain regions 102 and 103. An insulating material, for example, oxide, is formed on the substrate 100. After this, a contact window 107 is formed in the insulating material to form an insulating layer 106 shown in FIG. 1A. This exposes the source/drain region 102, which is electrically coupled with a capacitor formed in the follow-up steps.

A conductive layer 108 whose material is, for, example doped polysilicon is formed on the insulating layer 106 and fill the contact window 107 and to make contact with source/drain region 102.

Figure 1B:
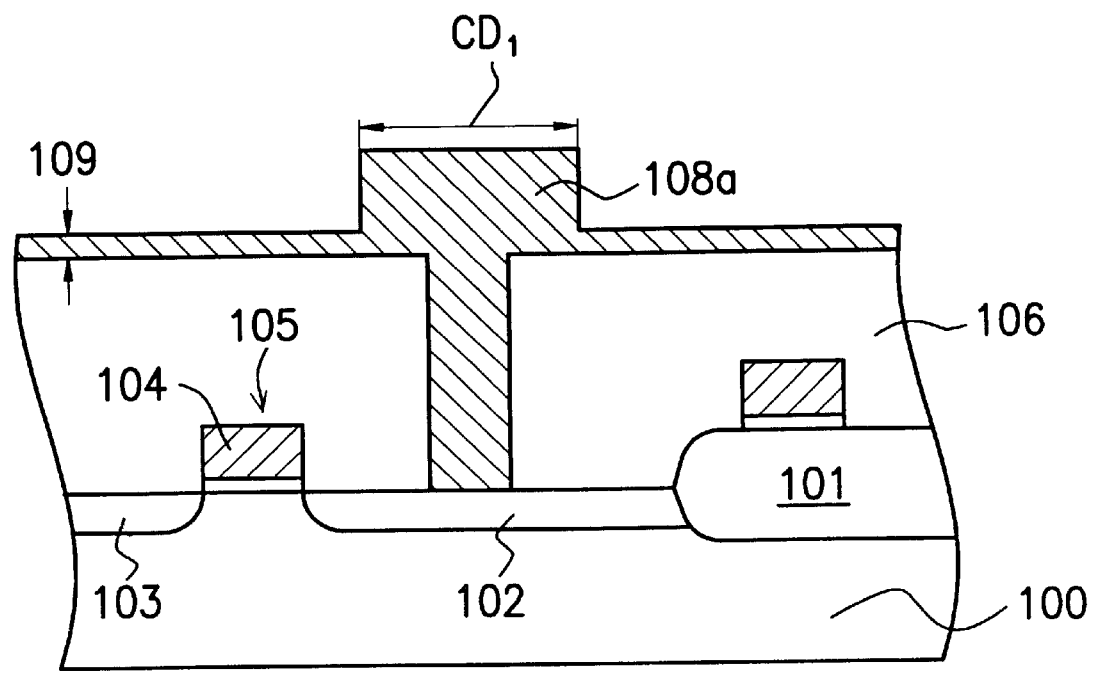
Figure 1C:
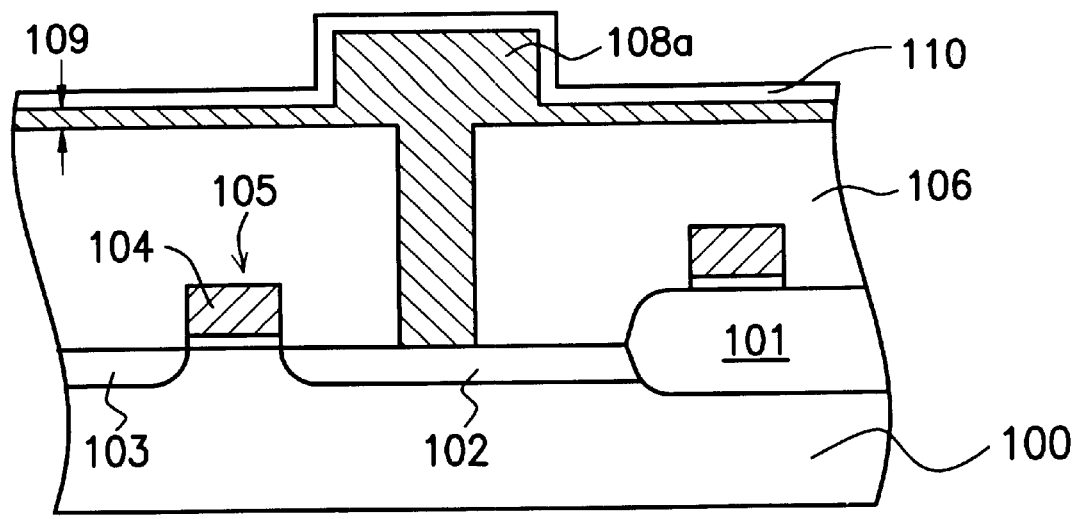

Next, referring to FIG. 1B, a first step for patterning a bottom electrode is performed. A photoresist is formed on the conductive layer 108 and defined to form a patterned conductive layer (not shown), which is smaller than the bottom electrode formed during post-steps. The conductive layer 108 is patterned through the photoresist to form conductive layer 108a. The critical dimension of the conductive layer 108a is $CD_1$. The conductive layer 108a is formed by, for example, etching. The conductive layer 108 not covered by the photoresist remains above the insulating layer 106 and has a thickness 109 of about 50~500 Å. The thickness 109 avoids formation of a tungsten silicide layer in post-process contacts with the insulating layer 106. Such a tungsten silicide layer would otherwise need to be formed in order to resolve the problem of particles forming at the interface between the tungsten silicide and the insulating layer, and to inhibit the tungsten silicide peeling. Referring to FIG. 1C, a tungsten silicide layer 110 is formed on the conductive layer 108a and has a thickness of about 500–1500 Å.

Figure 1D:
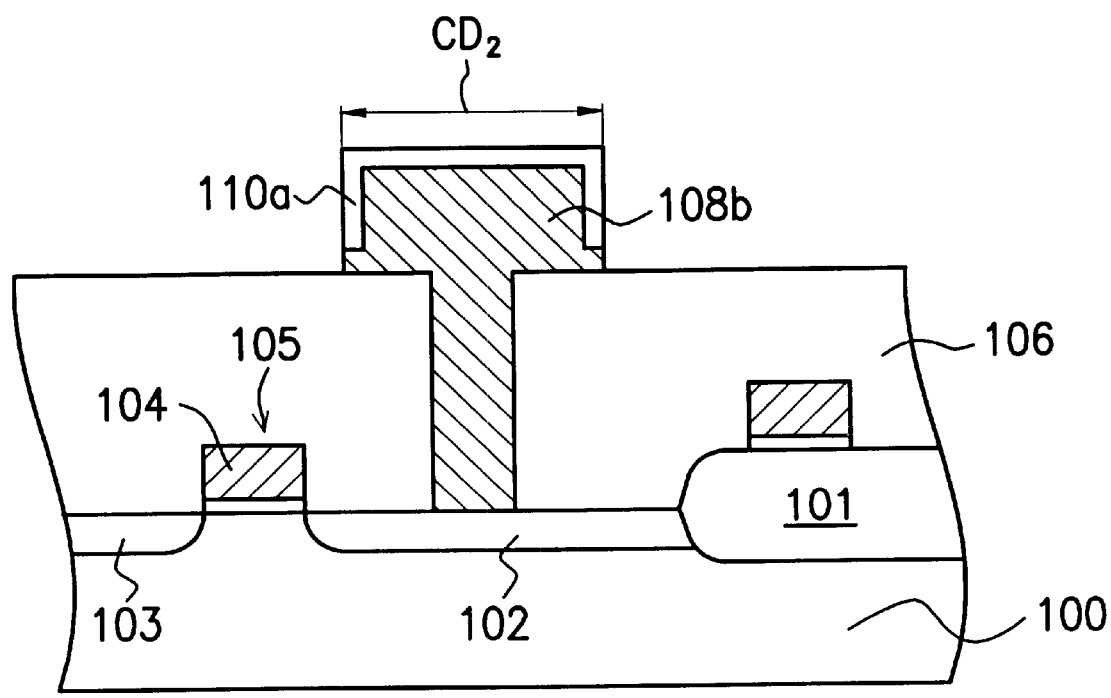

Referring to FIG. 1D, a second step for patterning the bottom electrode is performed. A photoresist (not shown) is provided on the tungsten silicide 110 and patterned to form a region of the bottom electrode. The conductive layer 108a is patterned with a critical dimension $CD_2$ through the photoresist to form a conductive layer 108b and to form a tungsten silicide layer 110a. The critical dimension $CD_2$ is larger than the critical dimension $CD_1$, and is formed by etching.

When the region of the bottom electrode is patterned through the photoresist, the problems of a photoresist misalignment and an etching bias are considered. If the value of the photoresist misalignment and the etching bias are "s" and the thickness of the deposited tungsten silicide is "t", the relationship between those are shown below:

$$(CD_2-t-CD_1)>s$$

Figure 1E:
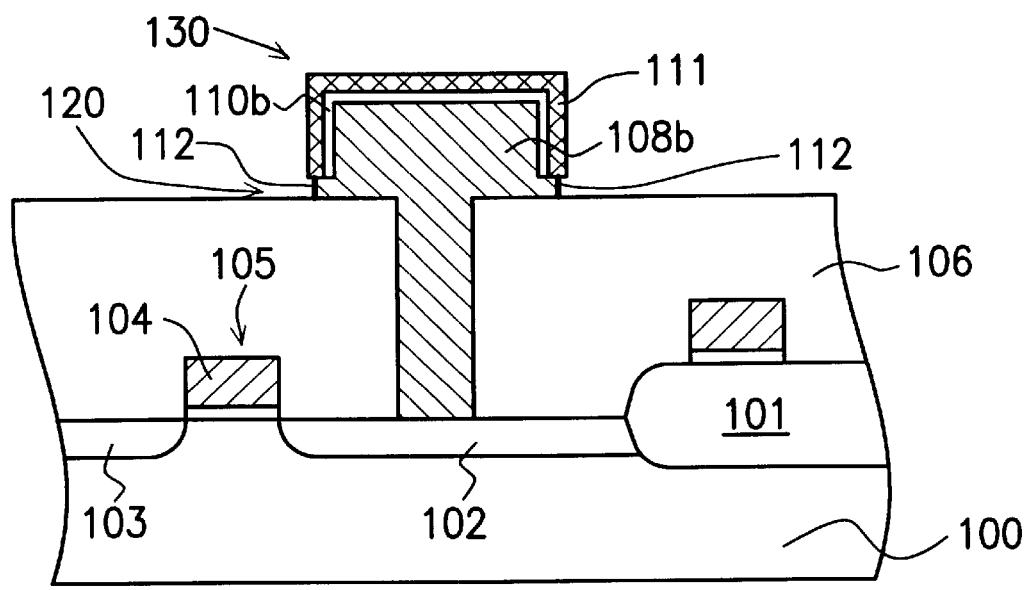

Referring to FIG. 1E, a nitrogen implantation process is performed, in which the substrate 100 is moved around to uniformly implant nitrogen into the tungsten silicide 110a. The implant energy is about 10–30 keV, and the dosage of nitrogen is about $5\times10^{14}$–$5\times10^{15}$ cm$^{-2}$. After this, a rapid thermal process is performed in a condition with ammonia ($NH_3$) at a temperature about 800–1000° C. Nitridation is carried out on part of the tungsten silicide 110a for about 15–90 seconds to form a tungsten nitride layer 111 on the surface of the tungsten silicide. A tungsten silicide layer 111b is formed from the tungsten silicide 110a remaining after nitridation. If the silicon atoms in tungsten silicide are under 2(x<2), the thickness of the tungsten nitride layer formed from nitridation is thicker.

The tungsten nitride layer is formed by the method described above. It also can be formed by physical vapor deposition (PVD) or chemical vapor deposition (CVD).

The conventional method of forming tungsten nitride is to execute a rapid thermal process after implanting nitrogen into tungsten silicide. The production rate is slow, and the product is non-uniform. The present invention provides a method of forming tungsten nitride in which a rapid thermal process is executed under ammonia gas. The method not only enhances the production rate of tungsten nitride but also achieves greater uniformity.

Further, part of the exposed portion of the conductive layer 108b reacts to form silicon nitride oxide layer 112 ($SiO_xN_y$) during execution of the rapid thermal process under ammonia gas. Forming the silicon nitride oxide layer 112 reduces production of original oxide. Because the dielectric constant of the silicon nitride oxide layer 112 is higher than that of the original oxide, the capacity of the capacitor is increased. In the back-ending process for forming an upper electrode, the exposed portion of the conductive layer 108b will be used to form a MIS capacitor structure. About 5% of all capacitor structures are MIS capacitor structures, and 95% are MIM capacitor structures.

Figure 1F:
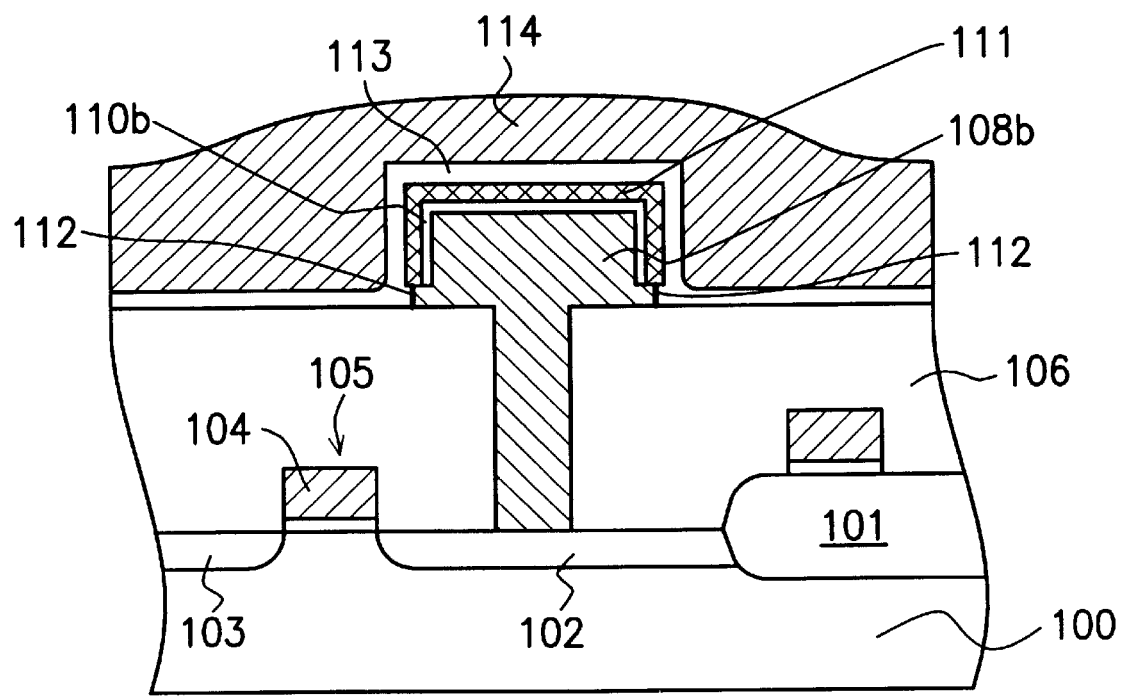

Referring to FIG. 1F, a dielectric layer 113 with a thickness of about 10–16 Å is formed on an exposed surface of the bottom electrode. The dielectric layer 113 can be a silicon oxide layer, a nitride-oxide (NO) structure, an oxide-nitride-oxide (ONO) structure or other dielectric material with a high dielectric constant, e.g. tantalum pentoxide ($Ta_2O_5$), lead zirconate titanate ($PbZrTiO_3$, PZT) or barium strontate titanate ($BaSrTiO_3$, BST). Thereafter, a conductive layer 114 as an upper electrode is formed on the surface of the dielectric layer 113. Accordingly, the capacitor structure is finished.

The method of fabricating a DRAM capacitor provided in this embodiment includes MIM structure 130 of about 95% and MIS structure 120 of about 5%. Furthermore, the MIM structure provided from the present invention prevents the leakage current formed in prior art. The MIM structure is simple, and the fabricating process is easily executed.

Second Embodiment

FIGS. 2A to 2E are cross-sectional views showing the process steps of a second embodiment process of fabricating a DRAM capacitor.

Figure 2A:
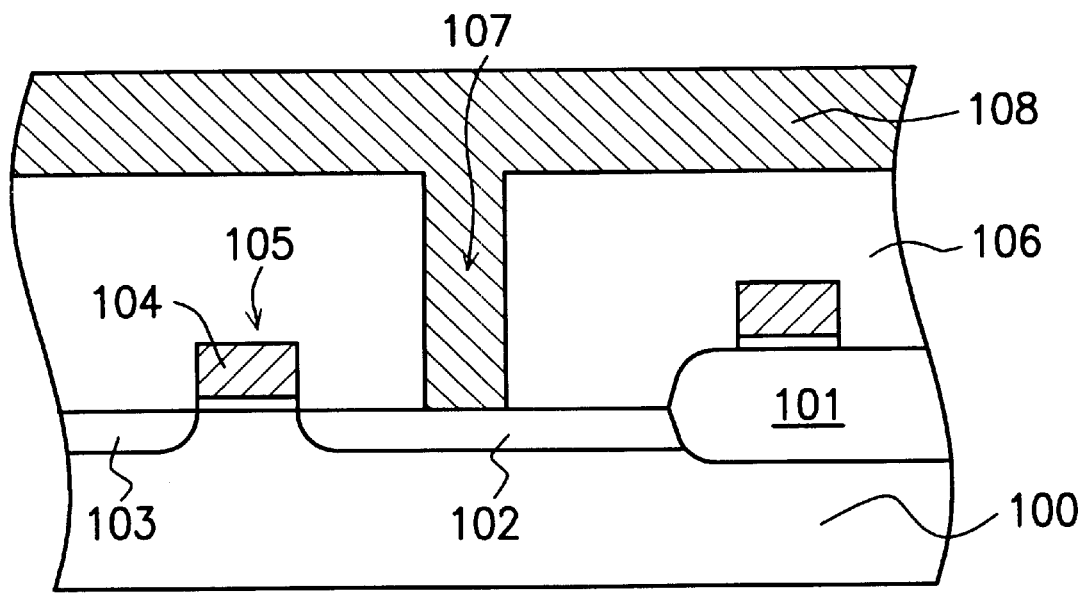
FIGS. 2A to 2D are cross-sectional views showing the process steps of a second embodiment process of fabricating a DRAM capacitor.

Referring first to FIG. 2A, since the structure and the materials are the same as those shown in FIG. 1A and the referential numbers are the same, description thereof will not be further detailed.

Figure 2B:
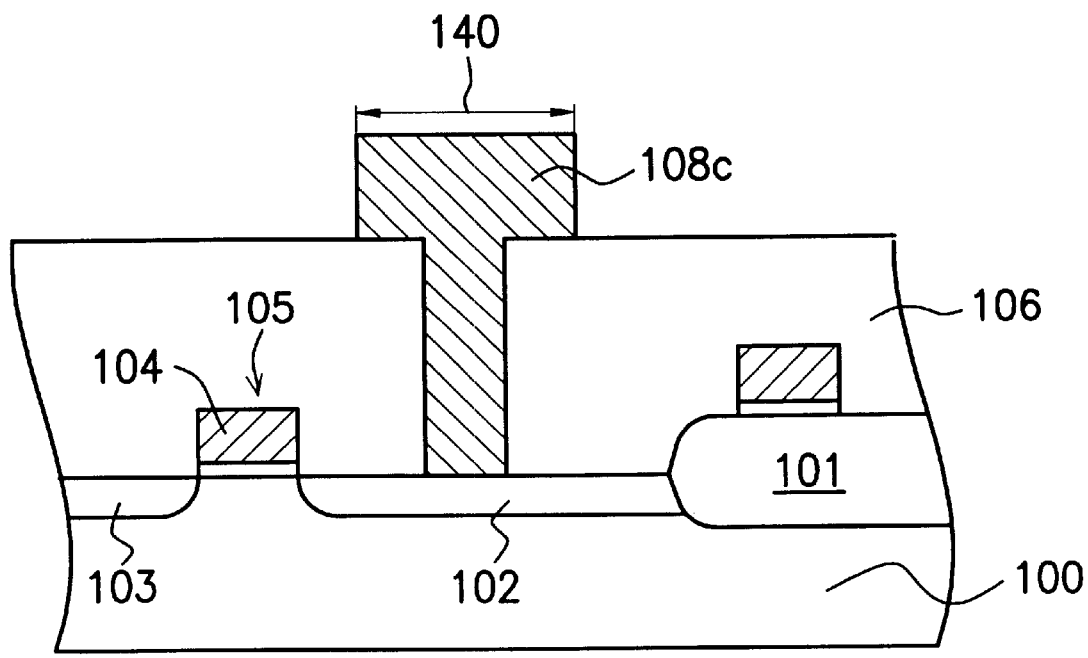

Referring to FIG. 2B, a region 140, which is smaller than the bottom electrode as formed in follow-up steps, is patterned, for example, by dry etching. The insulating layer 106 is used as an etching stop layer, and the conductive layer 108 is patterned to form a conductive layer 108c.

Figure 2C:
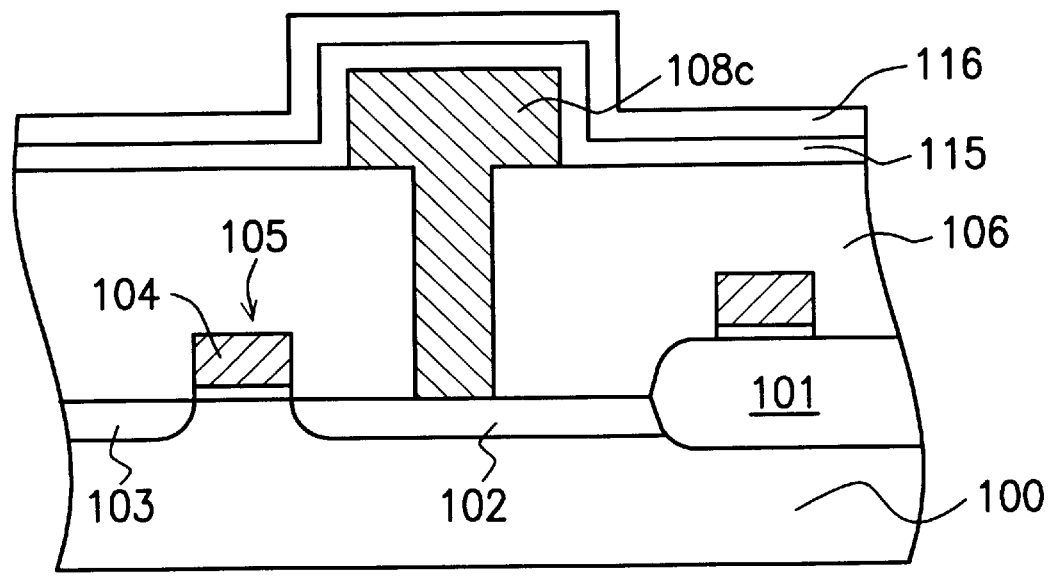
Figure 2D:
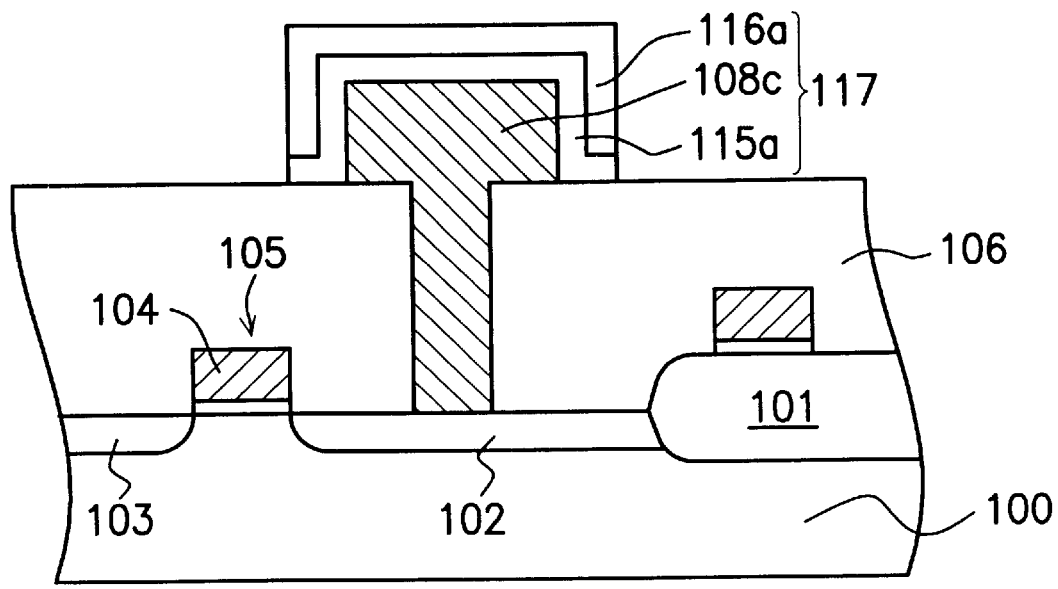

Referring to FIG. 2C, a barrier layer, for example, a titanium nitride layer 115 is formed on the conductive layer 108c. Thereafter, a tungsten nitride layer 116 is deposited by, for example, chemical vapor deposition or physical vapor deposition on the titanium nitride layer 115. Titanium nitride layer 115 prevents direct contact between polysilicon layer 108c and tungsten nitride layer 116; such contact would cause tungsten nitride layer to peel. Referring to FIG. 2D, an etching process is executed to pattern a bottom electrode 117. The titanium nitride layer 115 is patterned to form a titanium nitride layer 115a, and the tungsten nitride layer 116 is patterned to form a tungsten nitride layer 116a. The bottom electrode 117 of the DRAM capacitor comprises the titanium nitride layer 115a, the tungsten nitride layer 116a and the conductive layer 118c.

Next, the processes of forming a DRAM capacitor are performed . Since these processes are the same as shown in FIG. 1F, description thereof will not be further detailed.

Additionally, after finishing the structure shown in FIG. 2B, a tungsten silicide layer can alternatively be deposited on the conductive layer 108c Then, nitrogen is implanted into the tungsten silicide layer and treated by rapid thermal process under ammonia to form a tungsten nitride layer on the surface of the tungsten silicide layer. The processes to form the tungsten nitride layer are same as described in the first embodiment, so description thereof will not be further detailed.

This invention has the features described below:

(1) This invention provides a method of forming tungsten nitride. Nitrogen is implanted into a tungsten silicide layer and a rapid thermal process is executed under ammonia gas to form a tungsten nitride layer on the tungsten silicide layer.

(2) This invention provides a method which can increase the production rate of tungsten nitride and enhance uniformity.

(3) This invention can prevent the inconveniences of leakage current.

(4) The DRAM structure provided from this invention is simple, and the process of forming the structure is easily executed.

(5) This invention can prevent particles and peeling of the tungsten silicide forming at an interface between the tungsten silicide layer and the insulating layer.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a DRAM capacitor over a semiconductor substrate, the semiconductor substrate comprising a MOS transistor having a source/drain region and an insulating layer with an opening over the source/drain region, the method comprising the steps of:

forming a doped polysilicon layer to fill the opening and to connect with the source/drain region;

patterning the doped polysilicon layer in a manner such that a portion of the doped polysilicon layer over the opening is substantially thicker than the remaining portion of the doped polysilicon layer which cover a top surface of the insulating layer;

forming a tungsten silicide barrier layer on the patterned doped polysilicon layer;

patterning the tungsten silicide barrier layer and the patterned doped polysilicon layer so that a portion of the doped polysilicon layer between the insulating layer and the tungsten silicide barrier layer is exposed;

forming a tungsten nitride layer on the tungsten silicide barrier layer, wherein a rapid thermal annealing in an atmosphere of an ammonia is carried out during the formation of the tungsten nitride layer, wherein the exposed doped polysilicon layer is transformed into a silicon nitride oxide layer, thereby the tungsten nitride layer forms a bottom electrode of the DRAM capacitor, and forming a dielectric layer and an upper electrode on the bottom electrode to finish the structure of the DRAM capacitor.

2. A method according to claim 1, wherein the step of forming the tungsten nitride layer on the barrier layer comprises chemical vapor deposition.

3. A method according to claim 1, wherein the step of forming the tungsten nitride layer on the barrier layer comprises physical vapor deposition.

* * * * *